United States Patent [19]

Smolders et al.

[11] Patent Number: 5,114,308
[45] Date of Patent: May 19, 1992

[54] METHOD OF PLACING COMPONENTS ON CARRIERS AND DEVICE FOR CARRYING OUT THE METHOD

[75] Inventors: Jozef G. H. M. Smolders; Peter I. Sygall, both of Eindhoven, Netherlands

[73] Assignee: U.S. Philips Corporation, New York, N.Y.

[21] Appl. No.: 495,546

[22] Filed: Mar. 19, 1990

[30] Foreign Application Priority Data

Mar. 23, 1989 [NL] Netherlands .................. 8900715

[51] Int. Cl.⁵ .................. B23P 21/00; B65G 47/90
[52] U.S. Cl. .................. 414/799; 29/783; 29/791; 198/345.1; 414/786
[58] Field of Search ........... 198/345.1, 345.2, 345.3; 414/799, 786; 29/742, 757, 759, 783, 791, 836; 901/7

[56] References Cited

U.S. PATENT DOCUMENTS

| | | | |
|---|---|---|---|
| 4,202,092 | 5/1980 | Shibasaki et al. | 198/345.1 X |
| 4,239,576 | 12/1980 | Taki et al. | 156/297 |
| 4,346,514 | 8/1982 | Makizawa et al. | 29/740 |
| 4,372,802 | 2/1983 | Harigane et al. | 414/799 X |
| 4,476,627 | 10/1984 | Matsuura et al. | 29/791 |
| 4,677,808 | 7/1987 | Chenevard | 901/7 X |
| 4,733,459 | 3/1988 | Tateno | 901/7 X |
| 5,007,162 | 4/1991 | Weeber | 29/834 |

FOREIGN PATENT DOCUMENTS 62-4531  1/1987  Japan .................. 198/345.1

*Primary Examiner*—Robert J. Spar
*Assistant Examiner*—Janice Krizek
*Attorney, Agent, or Firm*—William Squire

[57] ABSTRACT

M sets of N component carriers each are placed in and removed from a component placement region one set at a time in a placement period. An empty carrier set is placed in the region as a full carrier set is removed while each set is displaced to a different one of M component placement heads having a fixed position. Each carrier receives M components. There are N sequentially occurring cycles in a placement period. A carrier of each set simultaneously receives a component in a placement cycle from a different one of the placement heads. Each head places one component at a time in a given position on a carrier in a placement cycle, each head corresponding to a given component type. The M sets of carrier are displaced simultaneously in a given cycle in the same direction in an x,y plane to a component receiving position. A given component type has the same position in each carrier.

10 Claims, 2 Drawing Sheets

METHOD OF PLACING COMPONENTS ON CARRIERS AND DEVICE FOR CARRYING OUT THE METHOD

FIELD OF THE INVENTION

The invention relates to a method of placing components on carriers, in which within a placement period a number of carriers are transported in a transport direction to a placement region, after which several placement cycles are carried out, during which components are picked up from supply positions and are then placed simultaneously on the carriers.

Of interest are commonly owned copending applications Ser. No. 460,460 entitled "Method and Device for Placing Components on a Support" filed Jan. 3, 1990 in the name of A. Weeber now U.S. Pat. No. 5,007,162 and Ser. No. 576,321 entitled "Device Comprising at least Two Manipulators, Positioning Device Suitable for Placing Electrical Components on a Support and a Pick-up Device Suitable for use in such a Position Device" filed Aug. 29, 1990 in the name of P. Corbeij and now U.S. Pat. No. 5,058,263.

BACKGROUND OF THE INVENTION

A method of the kind to which the present invention relates is known from U.S. Pat. No. 4,346,514. In this known method, components are picked up by placement heads and are then placed simultaneously on the carriers. When several components are placed by a placement head on the same carrier, a placement head must perform a movement in the x,y plane. A disadvantage of the method described above is that a separate driving mechanism for each placement head is required for performing these x,y movements.

SUMMARY OF THE INVENTION

The invention has for its object to provide a method of the kind described above, by which in an economical manner components can be placed with the aid of comparatively simple means on carriers and more particularly on multiple carriers. The term "multiple carrier" is to be understood to mean herein a carrier consisting of a number of identical subcarriers coupled to each other.

According to the invention, this object is mainly achieved in that in the same placement period after a placement cycle the carriers in the placement region are displaced simultaneously according to a same movement pattern in the x,y plane and a next placement cycle is carried out.

In contrast with the method according to U.S. Pat. No. 4,346,514, when components are placed on multiple carriers by means of the method according to the invention, the placement heads are once positioned and fixed and the multiple carriers are displaced simultaneously in the x,y plane so that the components can be placed simultaneously on different subcarriers. Preferably, each placement head places components of the same type at a predetermined area in the placement region.

In an embodiment of the method according to the invention, after a placement period the carriers are transported stepwise in the transport direction, at least one carrier being removed from the placement region and at least one fresh carrier being fed into the placement region. After a multiple carrier has passed through a number of placement periods and the required components have been placed on all subcarriers, this multiple carrier is removed stepwise in the transport direction and a fresh multiple carrier is fed into the placement region. In general, after each placement period only one multiple carrier will be removed in the transport direction. However, situations are conceivable, in which several multiple carriers are removed after one placement period.

The invention also relates to a device for carrying out the method. The device comprises a transport device for carriers, a number of placement heads and feeding mechanisms for components and is characterized by placement heads having a fixed stroke and by an elongate table displaceable in the x,y direction. When using placement heads having a fixed stroke, the construction of the device becomes simple. The device becomes even simpler when using placement heads having an identical fixed stroke.

The placement heads are once positioned and then place components at a predetermined area in the placement region. Due to the elongate table, several multiple carriers can be displaced in a simple manner simultaneously and according to the same desired movement pattern in the x,y plane. The table may be of the kind already proposed in a copending Patent Application of the Applicant Ser. No. 325,027, filed Mar. 16, 1989, now U.S. Pat. No. 5,078,253, which is a continuation of Ser. No. 123,401, filed Nov. 20, 1987, abandoned.

The invention will be described more fully with reference to the drawing. In the drawing.

DESCRIPTION OF THE PREFERRED EMBODIMENT

Figure 1:
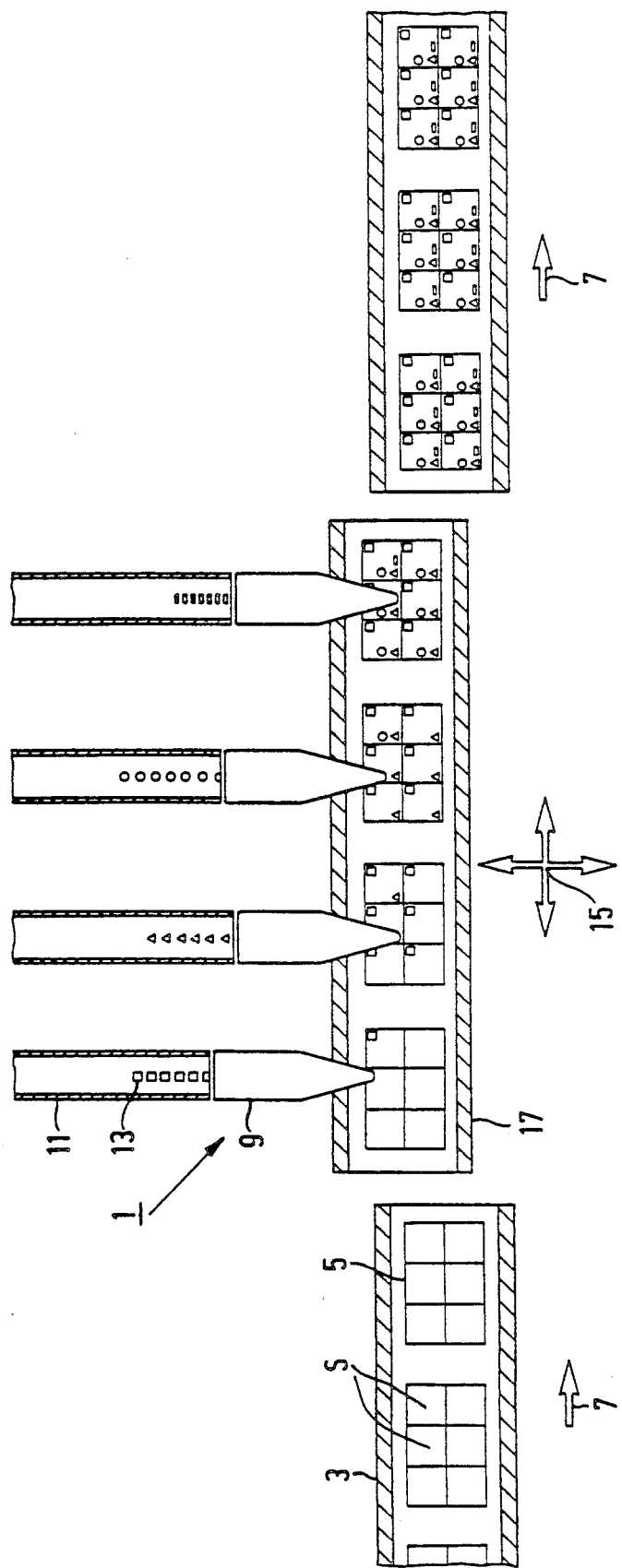
FIG. 1 shows diagrammatically an embodiment of a device according to the invention.

FIG. 1 shows diagrammatically an embodiment of a device 1 according to the invention mainly consisting of a transport device 3 for supplying and removing carriers 5 in the direction of the arrows 7, a number of placement heads 9, feeding mechanisms 11 for feeding components 13 and an elongate table 17 displaceable according to the arrows 15 in the x,y directions. The carriers 5 each comprise a number or set of identical subcarriers S coupled to each other. In the embodiment shown, four sextuple subcarrier sets of carriers 5 are positioned on the table 17. Each placement head 9 places a component 13 on each subcarrier S of the sextuple carriers 5. Each head 9 corresponds to a different set of subcarriers S. The transport device 3 for the carriers 5 supplies on one side empty carriers and removes full carriers on the other side.

Figure 2:
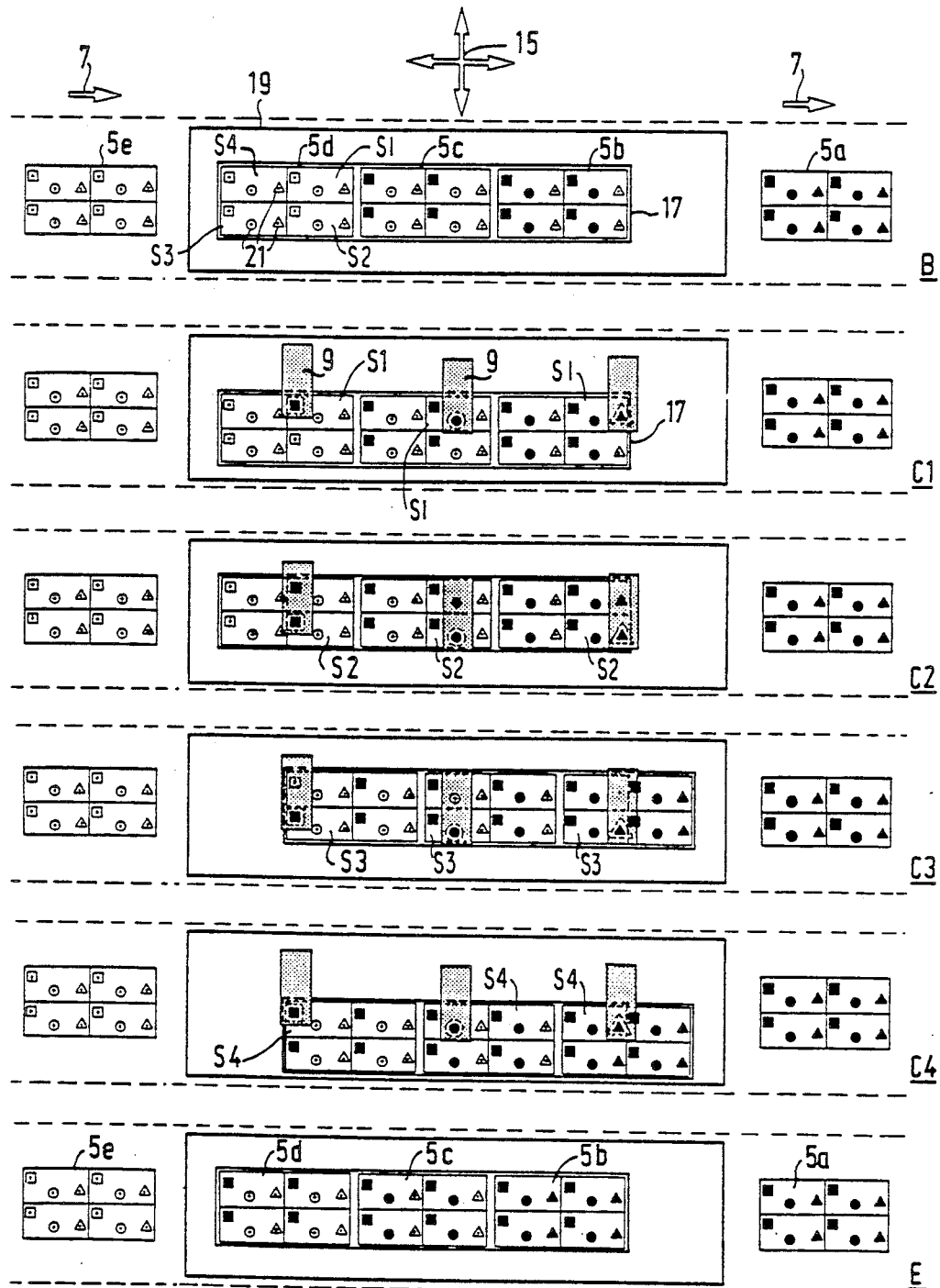
FIG. 2 shows carriers in different cycles of a placement period.

FIG. 2 shows diagrammatically carriers 5 in different placement cycles of a placement period. The parts corresponding to FIG. 1 are designated by the same reference numerals. In FIG. 2, the carriers 5, designated 5a–5e are in quadruple sets rather than sextuple sets as shown in FIG. 1 to illustrate the different possible implementation configurations.

The various situations and placement cycles are designated by B, C1, C2, C3, C4 and E. In FIG. 2, different component types are represented by different geometric figures, e.g., triangles, circles and squares. The positions of the components are represented by the light component geometric figures and actual components placed in position are represented by dark geometric figures. In the situation B, three quadruple sets of carriers 5b, 5c and 5d are shown in a placement region 19, which is covered by the table 17. On one side of the placement region 19, empty carriers are supplied; on the other side full carriers are removed in the transport direction 7. Reference numeral 5e designates an empty carrier set of subcarries still to be supplied and reference numeral 5a designates a removed full carrier. Set of subcarriers S each of the carriers 5a to 5e comprises identical subcarriers S1, S2, S3 and S4. Components must be placed on the carriers 5b to 5e in the marked positions 21 illustrated by the light geometric figures. Components are placed on the four subcarriers S1 to S4 of the carriers 5b, 5c and 5d during the placement cycles C1 to C4. In the placement cycle C1, components are placed on the three illustrated subcarriers S1; in the cycle C2, components are placed on the three subcarriers S2; in the cycle C3 components are placed on the three subcarriers S3 and in the cycle C4 components are placed on the three subcarriers S4. Between the various cycles, the quadruple carriers 5b, 5c and 5d are moved simultaneously according to the arrows 15 in the x, y plane. The placement heads 9 remain fixed in their adjusted positions. In the situation E, the result after placement of components in the cycles C1 to C4 is shown. All components 13 have now been placed on the quadruple carrier 5b and this carrier 5b can be removed in the transport direction 7.

A fresh carrier 5e is fed into the placement region 19; the multiple carriers 5c and 5d are passed on in direction 7 and the situation B is obtained again. A new placement period, in which components 13 are placed on the subcarriers of multiple carriers, can be started. When the components 13 have to be placed in a different configuration on the carriers, the placement heads 9 are fixed in a different position before a new placement period is started. During a placement period, the placement heads 9 are stationary.

As shown, a head 9 places the square components in carrier 5d in sequence on subcarriers S1, S2, S3 and S4, in the respective corresponding cycles C1, C2, C3 and C4. A second head 9 associated with carrier 5c places the circular components in sequence on subcarriers S1, S2, S3 and S4 in respective corresponding cycles C1-C4. A third head 9 associated with carrier 5b places the triangular components in sequence on subcarriers S1, S2, S3 and S4 in respective corresponding cycles C1-C4.

What is claimed is:

1. A method of placing components of different types on a plurality of carriers comprising:
   transporting during a first placement period a plurality of carriers in a transport direction to a placement region, after said transporting, processing a plurality of placement cycles in said first period, during each said cycle of the first period components of different types are fed to supply positions and are picked up from said supply positions and placed simultaneously on a plurality of carriers, each component type being placed on a corresponding carrier in a given placement cycle, after a first placement cycle in the first placement period simultaneously displacing said plurality of carriers in x, y directions in the placement region according to a given movement pattern in an x, y plane and then carrying out a next placement cycle of said first period.

2. A method as claimed in claim 1 including transporting the carriers stepwise in the transport direction during a second placement period so that at least one carrier is removed from the placement region and at least one fresh carrier is fed into the placement region.

3. A device for placing components on a plurality of component carriers comprising transport means for transporting said component carriers to a placement region, a first plurality of placement heads for placing a plurality of said components on a plurality of said carriers corresponding in number to said first plurality, means for feeding components of a different type to each respective placement head, said placement heads performing a fixed pick and place stroke for simultaneously placing said plurality of components on said plurality of carriers, said transport means including a table for releaseably receiving said carriers and including means for moving the table and carriers in x, y directions to position said carriers to receive components placed on said carriers by said heads during said stroke.

4. A component placement device comprising:
   means for transporting a plurality of component carriers to and from a component placement region, each carrier comprising a first set of subcarriers arranged in an array, said placement region receiving a second set of carriers;
   means for simultaneously placing a first component on a first subcarrier of each carrier in said second set during a given component placement stroke in a first cycle, each of the first components placed on the first subcarriers being of different types;
   means for feeding components of different types to said placing means; and
   means for simultaneously displacing said second set of carriers in said placement region in x, y directions in a given movement pattern after said simultaneous placing of said first component for positioning a second subcarrier of each carrier in said second set in a position for simultaneously receiving a second component from said means for placing in a second cycle, the second components placed in the second cycle being of the same types as the first components.

5. The device of claim 4 wherein said subcarriers are identical and said carriers are identical.

6. The device of claim 4 wherein said means for simultaneously placing includes a plurality of component placement heads, each head corresponding to a carrier, each head simultaneously placing a component on each of the subcarriers of a corresponding carrier during said second cycle.

7. The device of claim 4 wherein said subcarriers each receive a plurality of components, at least two of the components placed on a subcarrier being different, the components of each subcarrier having a given position on a subcarrier, the components of the same type occupying the same positions on each of the subcarriers.

8. The device of claim 4 wherein there are N subcarriers in an array and M component positions on each subcarrier, said means for simultaneously placing including M component placement heads, each head corresponding to a different carrier and to a different given component position on a subcarrier whereby the components are placed on said subcarriers in N cycles.

9. The device of claim 8 wherein the operating area of said heads define a placement region, said N cycles filling said M component positions on each subcarrier in said region with said components, said device including means for placing an empty carrier into said region and removing a full carrier from said region at the end of said N cycles.

10. A component placement device comprising:
- means for transporting a plurality of component carriers to and from a component placement region, each carrier comprising a first set of N subcarriers arranged in an array, each subcarrier having M component positions, said placement region receiving a second set of carriers;
- means for simultaneously placing a first component on a first subcarrier of each carrier in said second set during a given component placement stroke in a first cycle; and
- means for simultaneously displacing said second set of carriers in x, y directions in a given movement pattern in said placement region after said simultaneous placing of said first component for positioning a second subcarrier of each carrier in said second set in a position for simultaneously receiving a second component from said means for placing in a second cycle, said means for simultaneously placing including a plurality of M component placement heads, each head corresponding to a respective carrier and to a different component position on a subcarrier, each head simultaneously placing a component on its respective subcarrier of a corresponding carrier during said second cycle whereby the components are placed on said subcarriers in N cycles; and means for feeding components to said placement heads.

* * * * *